United States Patent
Park et al.

(10) Patent No.: US 9,391,548 B2
(45) Date of Patent: Jul. 12, 2016

(54) MOTOR DRIVING DEVICE FOR VEHICLE

(71) Applicants: Hyundai Motor Company, Seoul (KR); Kia Motors Corporation, Seoul (KR)

(72) Inventors: Choong Seob Park, Gyeonggi-do (KR); Ho Deuk Song, Seoul (KR)

(73) Assignees: Hyundai Motor Company, Seoul (KR); Kia Motors Corporation, Seoul (KR)

(*) Notice: Subject to any disclaimer, the term of this patent is extended or adjusted under 35 U.S.C. 154(b) by 133 days.

(21) Appl. No.: 14/329,082

(22) Filed: Jul. 11, 2014

(65) Prior Publication Data

US 2015/0249407 A1    Sep. 3, 2015

(30) Foreign Application Priority Data

Mar. 3, 2014 (KR) .......... 10-2014-0025118

(51) Int. Cl.
*H02P 6/08* (2016.01)
*H02P 7/29* (2016.01)
*H02P 6/14* (2016.01)
(Continued)

(52) U.S. Cl.
CPC .............. *H02P 6/142* (2013.01); *H02M 1/08* (2013.01); *H02M 1/44* (2013.01); *H03K 17/162* (2013.01)

(58) Field of Classification Search
CPC ......... H02P 27/08; H02P 6/002; H02P 6/182; H02P 6/14; H02P 27/085; H02P 6/08; H02P 6/20; H02P 31/00; H02P 6/085; H02P 6/142; H02P 6/16; H02P 6/18; H02P 21/0035; H02P 6/001; H02P 7/29; H02P 21/0039
USPC .......... 318/244, 245, 246; 388/828, 829, 830, 388/831

See application file for complete search history.

(56) References Cited

U.S. PATENT DOCUMENTS 4,673,851 A * 6/1987 Disser ............... H02M 1/14 318/599
5,201,023 A * 4/1993 Motzko ............ B05C 17/0308 388/815

(Continued)

FOREIGN PATENT DOCUMENTS

CN  103016681    4/2013
DE  102011056311 A1  3/2013

(Continued)

OTHER PUBLICATIONS

"A development of a BLDC motor control dedicated semiconductor and sunroof system optimization for improved durability", by Park, Choong Seob; Song, Ho Deuk; Park, Hoo Sang; and Kim, Young Soo, Hyundai Motor Company Research Conference, Jul. 19, 2013.

*Primary Examiner* — Bentsu Ro
(74) *Attorney, Agent, or Firm* — Mintz Levin Cohn Ferris Glovsky and Popeo, P.C.; Peter F. Corless (57) ABSTRACT

A motor driving device for a vehicle includes a brushless DC (BLDC) motor driving device for optimizing electromagnetic compatibility (EMC). The motor driving device includes: a motor controller that controls driving of a motor in response to an operation of a switching element; and a drive semiconductor that controls a drive current of the motor controller in response to a predetermined register value, and controls electromagnetic compatibility (EMC) tuning by adjusting a switching time of the switching element in response to a drive current that is charged or discharged in or from the motor controller.

11 Claims, 4 Drawing Sheets

(51) Int. Cl.
*H02M 1/44* (2007.01)
*H02M 1/08* (2006.01)
*H03K 17/16* (2006.01)

(56) References Cited

U.S. PATENT DOCUMENTS

| | | | |
|---|---|---|---|
| 5,742,142 A * | 4/1998 | Witt | H02P 7/29 |
| | | | 318/400.09 |
| 5,811,948 A * | 9/1998 | Sato | H03K 17/166 |
| | | | 318/400.11 |
| 5,892,339 A | 4/1999 | Park et al. | |
| 6,181,093 B1 | 1/2001 | Park et al. | |
| 7,112,936 B2 | 9/2006 | Lee | |
| 7,313,005 B2 * | 12/2007 | Azuma | H03K 7/08 |
| | | | 318/599 |
| 2007/0227805 A1 | 10/2007 | Walz | |
| 2012/0086382 A1 * | 4/2012 | Peto | H02M 1/4225 |
| | | | 318/729 |
| 2012/0280271 A1 | 11/2012 | Ichikawa | |
| 2013/0074627 A1 | 3/2013 | Park | |
| 2013/0152712 A1 | 6/2013 | Park et al. | |
| 2014/0167100 A1 | 6/2014 | Ichikawa | |

FOREIGN PATENT DOCUMENTS

| | | |
|---|---|---|
| JP | 3726219 | 12/2005 |
| JP | 2007-238086 A | 9/2007 |
| JP | 2012-235378 A | 11/2012 |
| JP | 2013068321 | 4/2013 |
| KR | 10-0174492 | 11/1998 |
| KR | 10-1999-0023230 A | 3/1999 |
| KR | 10-1999-0069621 | 9/1999 |
| KR | 10-2000-0014512 | 3/2000 |
| KR | 10-0258434 | 6/2000 |
| KR | 10-2001-0011153 | 2/2001 |
| KR | 10-2006-0005516 | 1/2006 |
| KR | 10-2009-0026524 A | 3/2009 |
| KR | 10-2010-0078841 | 7/2010 |
| KR | 10-1047759 | 7/2011 |
| KR | 10-1397923 | 1/2013 |
| KR | 10-2013-0032604 | 4/2013 |
| KR | 10-1263010 | 5/2013 |

* cited by examiner

MOTOR DRIVING DEVICE FOR VEHICLE

CROSS-REFERENCE TO RELATED APPLICATION

This application is based on and claims under 35 U.S.C. §119(a) the benefit of Korean patent application No. 10-2014-0025118 filed on Mar. 3, 2014, the disclosure of which is hereby incorporated in its entirety by reference.

BACKGROUND (a) Field of the Invention

The present invention relates to a motor driving device for vehicles, and more particularly to a technology of a brushless DC (BLDC) motor driving device configured to optimize electromagnetic compatibility (EMC).

(b) Description of the Related Art

In general, a BLDC motor does not include a brush serving as a commutator of a general DC motor, and is designed to retain unique characteristics of the DC motor without change. The BLDC motor includes a rotor, a stator composed of a 3-phase coil (U-phase coil, V-phase coil, and W-phase coil), a rotor composed of a permanent magnet, and a position detection sensor.

The BLDC motor applies a current to each phase of the stator coil of the 3-phase BLDC motor, and generates a magnetic field in the coil due to the flowing current so that the rotor begins to rotate. In this case, the BLDC motor detects the magnitude of a magnetic field of the rotor, and sequentially switches on or off the switching elements for switching the direction of a current flowing to each phase of the coil in response to the intensity of detected magnetic field, such that the rotor can continuously rotate in one direction.

Meanwhile, electromagnetic compatibility (EMC) indicates that an objective device is affected by electromagnetic waves generated from other devices. If the objective device is affected by EMC, a failure rate of a motor or controller of the device inevitably increases.

In accordance with a conventional motor driving semiconductor, resistors and capacitors located outside of the semiconductor are replaced with others, and a switching time of the switching element contained in a motor controller is adjusted to perform EMC tuning. In particular, passive elements (e.g., resistors, capacitors, etc.) contained in the motor controller are replaced with other elements during the development process, and tuning of electromagnetic waves is performed.

However, the conventional motor driving device has difficulty in discriminating between a rising time and a falling time of motor control pulses, so that it is very difficult for the conventional motor driving device to be precisely tuned. In addition, the conventional motor driving device is affected by variation of an external power source such that it has technical limitation in EMC tuning.

SUMMARY

Various embodiments of the present invention are directed to providing a motor driving device for a vehicle.

An embodiment of the present invention relates to controlling a slew rate through a register contained in a drive semiconductor, and precisely controlling a constant current by classifying the charging/discharging current amount into multiple stages.

An embodiment of the present invention relates to facilitating EMC tuning according to an algorithm of predetermined software.

In accordance with an aspect of the embodiment, a motor driving device for a vehicle includes: a motor controller configured to control driving of a motor in response to an operation of a switching element; and a drive semiconductor configured to control a drive current of the motor controller in response to a predetermined register value, and control electromagnetic compatibility (EMC) tuning by adjusting a switching time of the switching element in response to a drive current charged or discharged in or from the motor controller.

It is to be understood that both the foregoing general description and the following detailed description of the present invention are exemplary and explanatory and are intended to provide further explanation of the invention as claimed.

DETAILED DESCRIPTION OF THE EMBODIMENTS

Reference will now be made in detail to the embodiments of the present invention, examples of which are illustrated in the accompanying drawings. Wherever possible, the same reference numbers will be used throughout the drawings to refer to the same or like parts.

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g. fuels derived from resources other than petroleum). As referred to herein, a hybrid vehicle is a vehicle that has two or more sources of power, for example both gasoline-powered and electric-powered vehicles. The terminology used herein is for the purpose of describing particular embodiments only and is not intended to be limiting of the invention.

As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

Figure 1:
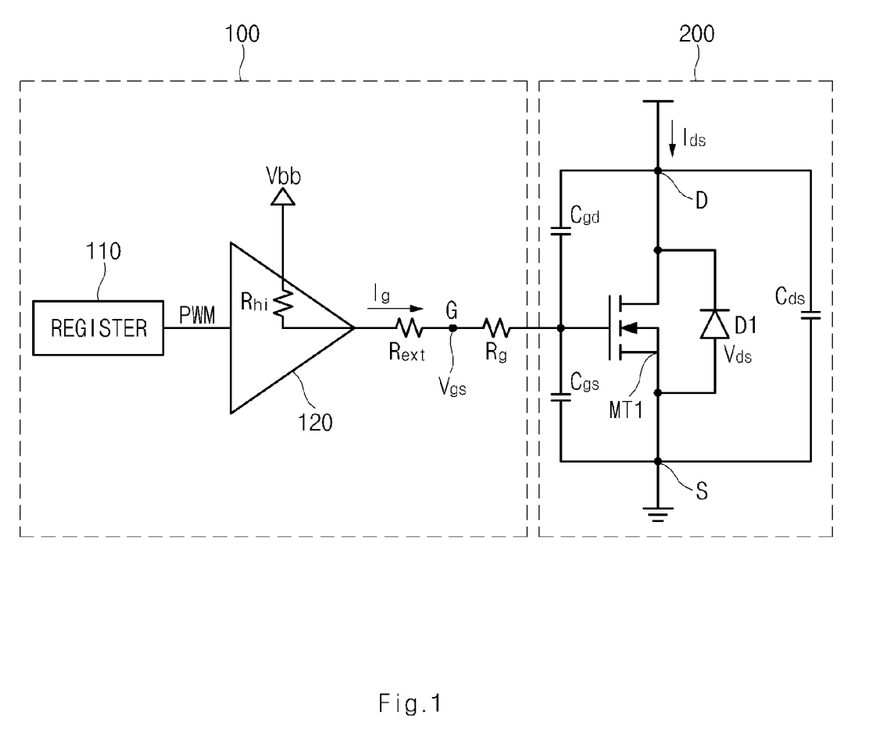
FIG. 1 is a block diagram illustrating a motor driving device of a vehicle according to an embodiment of the present invention.

FIG. 1 is a block diagram illustrating a motor driving device of a vehicle according to an embodiment of the present invention.

Referring to FIG. 1, the motor driving device includes a drive semiconductor 100 and a motor controller 200. In particular, the drive semiconductor 100 includes a register 110, a drive unit 120, and resistors ($R_{ext}$, $R_g$). The drive unit 120 includes a drive resistor ($R_{hi}$). In addition, the motor controller 200 includes a plurality of capacitors ($C_{gd}$, $C_{gs}$, $C_{ds}$), a diode D1, and a switching element MT1.

The register 110 stores information regarding a slew rate for controlling a turn-on time of the drive unit 120. The register 110 outputs a pulse width modulation (PWM) signal for adjusting the slew rate of the drive unit 120 to the drive unit 120. A switching time of the switching element MT1 is adjusted in the drive semiconductor 100 in response to the PWM signal, such that EMC optimization tuning is facilitated.

In particular, according to the present invention, an algorithm for controlling the slew rate preferably is pre-configured in the register 110 by software. Accordingly, a high-level enable period of the PWM signal is configured in response to a value configured in the register 110.

For example, if the value configured in the register 110 is set to a first value, a high-level enable period of the PWM signal is set to a first delay time, such that a turn-on time of the switching element MT1 can be set to a first time. If the value configured in the register 110 is set to a second value, a high-level enable period of the PWM signal is set to a second delay time longer than the first delay time, such that a turn-on time of the switching element MT1 can be set to a second time longer than a first time.

The drive unit 120 drives the charging/discharging current for controlling the motor in response to the PWM signal, and outputs the driven charging/discharging current. In particular, upon receiving the PWM signal, the drive unit 120 converts the charging/discharging current into a specific signal including both a voltage value and a current value for driving the switching element MT1.

The drive unit 120 is configured to use the resistor ($R_{hi}$) for driving the charging/discharging current. The resistor ($R_{hi}$) is coupled between an output terminal of the drive unit 120 and a back-bias voltage terminal ($V_{bb}$), such that a current ($I_g$) flowing in the resistor ($R_{ext}$) is controlled. In addition, the switching time of the switching element MT1 can be adjusted in response to a resistance value of the resistor ($R_{hi}$).

The resistor ($R_{ext}$) is coupled between an output terminal of the drive unit 120 and a node G. In this case, the voltage flowing in the node G may be denoted by a drive voltage ($V_{gs}$). In addition, the resistor ($R_g$) is coupled between the node G and the motor controller 200.

In addition, the motor controller 200 controls the drive current ($I_{ds}$) flowing in the motor in response to the drive voltage ($V_{gs}$) received through the resistor ($R_g$). Accordingly, the motor controller 200 drives the motor in one direction in response to the drive current ($I_{ds}$).

Capacitors ($C_{gd}$, $C_{gs}$, $C_{ds}$) may control the charging operation of the drive current ($I_{ds}$) applied to the motor in response to the drive voltage ($V_{gs}$). In this case, the capacitors ($C_{gd}$, $C_{gs}$) are coupled in series between a node D and a node S. The capacitor ($C_{ds}$) is coupled between the node D and the node S. In addition, the switching element MT1 for motor driving may control the charging/discharging operation of the drive current ($I_{ds}$) in response to the drive voltage ($V_{gs}$).

The switching element MT1 is coupled between the node D and the node S, and the switching state is controlled by the drive voltage ($V_{gs}$). In this case, the switching time of the switching element MT1 is controlled by the output current ($I_g$) of the drive unit 120, a value of the resistor ($R_{ext}$), and a parasitic capacitance value of the switching element MT1.

The switching element MT1 according to the embodiments may be formed of a Metal Oxide Semiconductor Field Effect Transistor (MOSFET).

The MOSFET is coupled between the node D and the node S such that the MOSFET receives a drive voltage ($V_{gs}$) through a gate terminal. The switching element MT1 according to the embodiments may be formed of an NMOS-type MOSFET.

For example, if the drive voltage ($V_{gs}$) of a logic high level is applied to the switching element MT1, the switching element MT1 is turned on so that the drive current ($I_{ds}$) flows in the switching element MT1 through the node D and the node S. In contrast, if the drive voltage ($V_{gs}$) of a logic low level is applied to the switching element MT1, the switching element MT1 is turned off so that capacitors ($C_{gd}$, $C_{gs}$, $C_{ds}$) are charged with the drive current ($I_{ds}$).

A diode D1 is coupled between the node D and the node S. The diode D1 is coupled in a forward direction between the node S and the node D, so that the diode D1 has a voltage level of Vds.

Figure 2:
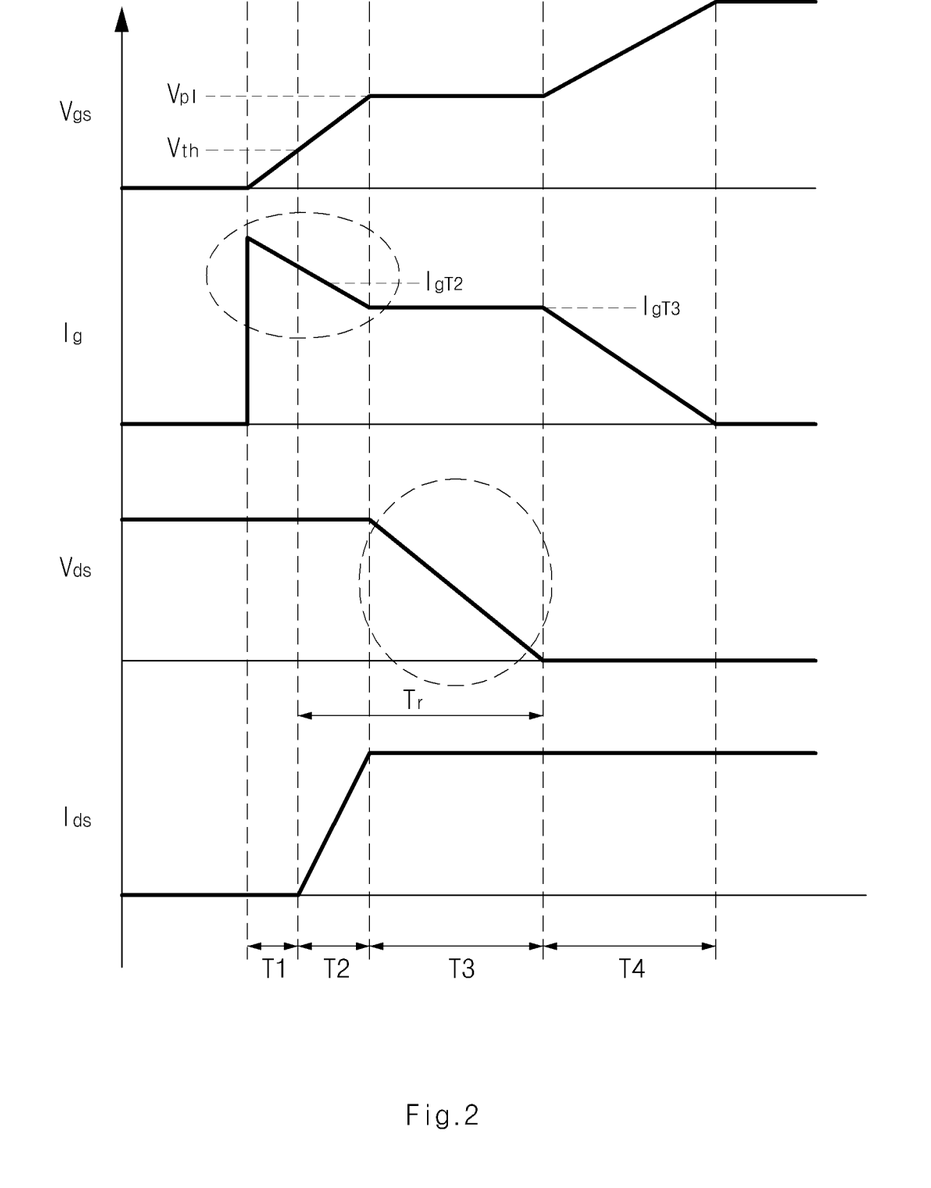
FIG. 2 is a timing diagram illustrating operation of the motor driving device shown in FIG. 1.

FIG. 2 is a timing diagram illustrating an operation of the motor driving device shown in FIG. 1 according to an embodiment. The operation of the motor driving device shown in FIG. 1 will hereinafter be described with reference to FIG. 2.

First, prior to reaching the period T1, the drive voltage ($V_{gs}$), the current ($I_g$), and the drive current ($I_{ds}$) are maintained at a low-level state. The voltage ($V_{ds}$) is maintained at a high-level state.

Thereafter, during the period T1, the PWM signal is applied to the drive semiconductor 100, the current ($I_g$) is transitioned to a high level, so that the drive voltage ($V_{gs}$) gradually increases. The current ($I_g$) gradually increases up to the current level of IgT2 or higher, and then gradually decreases. The drive voltage ($V_{gs}$) increases by a threshold voltage ($V_{th}$).

In this case, the current ($I_g$) is limited by the resistor ($R_{hi}$) of the drive unit 120 and the resistors ($R_{ext}$, $R_g$) such that the current ($I_g$) is prevented from excessively increasing. In this case, the resistor ($R_{ext}$) of the drive unit 120 has a resistance value higher than those of the resistors ($R_{ext}$, $R_g$).

Subsequently, during the period T2, a level of the current ($I_g$) is reduced to the level IgT2 or less. The drive voltage ($V_{gs}$) increases up to a voltage level ($V_{pl}$). The voltage ($V_{pl}$) may correspond to a plateau voltage for increasing the drive voltage ($V_{gs}$).

As a result, the switching element MT1 of the motor controller 200 is turned on. In this case, if the drive voltage ($V_{gs}$) increases up to the threshold voltage ($V_{th}$) or higher, the switching element MT1 is turned on. Accordingly, during the period T2, a current level of the drive current ($I_{ds}$) gradually increases such that the capacitor ($C_{gs}$) is charged with the drive current ($I_{ds}$).

In this case, the switching time of the switching element MT1 is associated with a frequency of the PWM signal. As the switching time gradually increases, harmonic components of the PWM signal are gradually reduced, resulting in reduction of the frequency. From the viewpoint of electromagnetic compatibility (EMC), the slope of the voltage ($V_{ds}$) is of importance to the relationship between the switching time of the switching element MT1 and EMC.

Accordingly, the motor driving device for a vehicle according to the present invention can precisely control the frequency and slew rate of the PWM signal in response to a specific value that is configured in the register 110 by software. In particular, the rising time and the falling time of the switching element MT1 are distinguished from each other according to the drive voltage ($V_{ds}$) such that EMC tuning is facilitated. The switching time of the switching element MT1 is affected by various factors, for example, a resistance value of the resistor ($R_{hi}$), a threshold voltage ($V_{th}$) of the switching element MT1, a plateau voltage ($V_{pl}$), and a supply voltage.

Subsequently, during the period T3, the drive voltage ($V_{gs}$) is maintained at a predetermined voltage ($V_{pl}$) level. The current ($I_g$) is reduced to a predetermined current level IgT2 or less, such that the current ($I_g$) is maintained at the current level IgT3. As a result, the voltage level ($V_{ds}$) is gradually reduced.

If the current ($I_g$) is limited by the resistor ($R_{hi}$), the slope along which the voltage ($V_{ds}$) is reduced is not affected by the supply voltage. The drive current ($I_{ds}$) is maintained at a predetermined current level. In this case, the capacitor ($C_{gd}$) is charged with the current value ($I_g$) before the voltage ($V_{ds}$) is reduced to zero (0V).

As described above, the rising time before the switching element MT1 is enabled to a logic high level is denoted by the duration (T2+T3). The falling time of the switching element MT1 may also be denoted by the duration (T2+T3). Accordingly, the switching time of the switching element MT1 may be adjusted by a resistance value of the resistor ($R_{hi}$).

Subsequently, during the period T4, the drive voltage ($V_{gs}$) level gradually increases up to the voltage ($V_{pl}$) or higher, and the current level ($I_g$) gradually decreases to a desired level IgT3 or less, such that the drive voltage ($V_{ds}$) is transitioned to a low level state and the drive current ($I_{ds}$) is maintained at a high level state.

As described above, the motor driving device for a vehicle according to the present invention classifies a control period of the charging/discharging current amount into four stages T1~T4, and more precisely controls the charging/discharging current amount according to the four stages T1~T4, such that EMC tuning is facilitated. In addition, the motor driving device according to the embodiments can be applied to a vehicle semiconductor, a body controller, a BLDC motor drive semiconductor, and the like.

Figure 3:
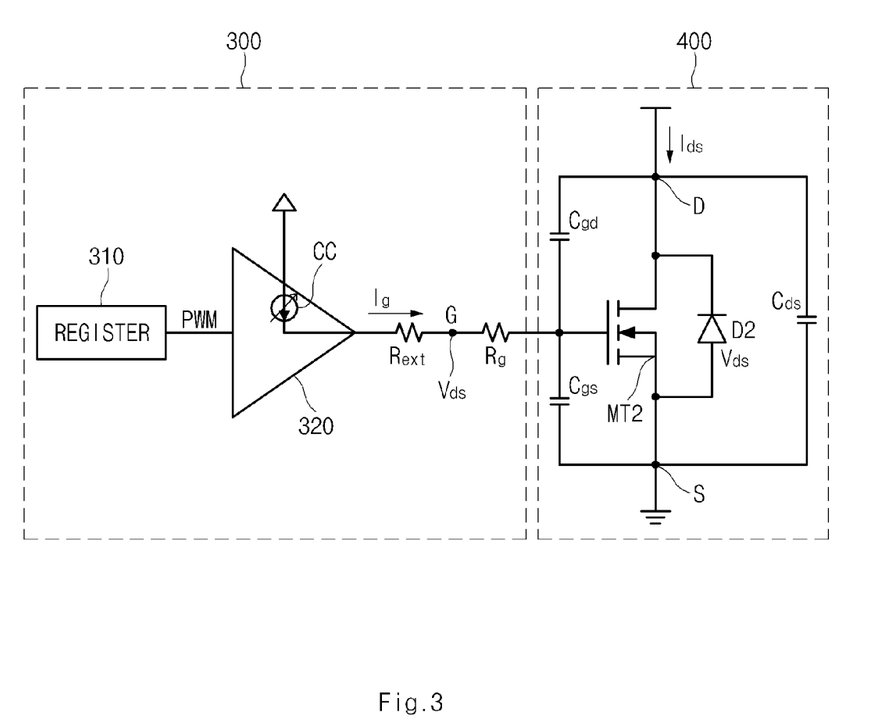
FIG. 3 is a block diagram illustrating a motor driving device for a vehicle according to another embodiment of the present invention.

FIG. 3 is a block diagram illustrating a motor driving device for a vehicle according to another embodiment of the present invention.

Referring to FIG. 3, the motor driving device for a vehicle includes a drive semiconductor 300 and a motor controller 400. In this case, the drive semiconductor 300 includes a register 310, a drive unit 320, and resistors ($R_{ext}$, $R_g$). The drive unit 320 includes a constant-current source CC. In addition, the motor controller 400 includes a plurality of capacitors ($C_{gd}$, $C_{gs}$, $C_{ds}$), a diode D2, and a switching element MT2.

The register 310 stores information regarding a slew rate for controlling a turn-on time of the drive unit 320. The register 310 outputs a pulse width modulation (PWM) signal for adjusting the slew rate of the drive unit 320 to the drive unit 320. A switching time of the switching element MT12 is adjusted in the drive semiconductor 300 in response to the PWM signal, such that EMC optimization tuning is facilitated.

In particular, according to the present invention, an algorithm for controlling the slew rate preferably is pre-configured in the register 310 by software. Accordingly, a high-level enable period of the PWM signal is configured in response to a value configured in the register 310.

For example, if the value configured in the register 110 is set to a first value, a high-level enable period of the PWM signal is set to a first delay time, such that a turn-on time of the switching element MT2 can be set to a first time. If the value configured in the register 310 is set to a second value, a high-level enable period of the PWM signal is set to a second delay time longer than the first delay time, such that a turn-on time of the switching element MT2 can be set to a second time longer than a first time.

The drive unit 320 drives the charging/discharging current for controlling the motor in response to the PWM signal, and outputs the driven charging/discharging current. In particular, upon receiving the PWM signal, the drive unit 320 converts the charging/discharging current into a specific signal including both a voltage value and a current value for driving the switching element MT2.

The drive unit 320 is configured to use the constant-current source CC for driving the charging/discharging current. The constant-current source CC is coupled between an output terminal of the drive unit 320 and a ground voltage terminal, such that a current ($I_g$) flowing in the resistor ($R_{ext}$) is controlled. In this case, the current ($I_g$) may correspond to a programmable current for driving the motor controller 400. In addition, the switching time of the switching element MT2 can be adjusted in response to the current level ($I_g$) changing with a current value of the constant-current source CC.

The resistor ($R_{ext}$) is coupled between an output terminal of the drive unit 320 and a node G. If the output signal of the drive unit 320 is at a logic high level, the resistor ($R_{ext}$) flowing in the node G is limited. In this case, the voltage flowing in the node G may be denoted by a drive voltage ($V_{gs}$). In addition, the resistor ($R_g$) is coupled between the node G and the motor controller 300.

In addition, the motor controller 300 controls the drive current ($I_{ds}$) flowing in the motor in response to the drive voltage ($V_{gs}$) received through the resistor ($R_g$). Accordingly, the motor controller 300 drives the motor in one direction in response to the drive current ($I_{ds}$).

Capacitors ($C_{gd}$, $C_{gs}$, $C_{ds}$) may control the charging operation of the drive current ($I_{ds}$) applied to the motor in response to the drive voltage ($V_{gs}$). In this case, the capacitors ($C_{gd}$, $C_{gs}$) are coupled in series between a node D and a node S. The capacitor ($C_{ds}$) is coupled between the node D and the node S. In addition, the switching element MT2 for motor driving may control the charging/discharging operation of the drive current ($I_{ds}$) in response to the drive voltage ($V_{gs}$).

The switching element MT2 is coupled between the node D and the node S, and the switching state is controlled by the drive voltage ($V_{gs}$). In this case, the switching time of the switching element MT2 is controlled by the output current ($I_g$) of the drive unit 320, a value of the resistor ($R_{ext}$), and a parasitic capacitance value of the switching element MT2. The switching element MT2 according to the embodiments may be formed of a Metal Oxide Semiconductor Field Effect Transistor (MOSFET).

The MOSFET is coupled between the node D and the node S such that the MOSFET receives a drive voltage ($V_{gs}$) through a gate terminal. The switching element MT2 according to the embodiments may be formed of an NMOS-type MOSFET.

For example, if the drive voltage ($V_{gs}$) of a logic high level is applied to the switching element MT2, the switching element MT2 is turned on so that the drive current ($I_{ds}$) flows in the switching element MT2 through the node D and the node S. In contrast, if the drive voltage ($V_{gs}$) of a logic low level is applied to the switching element MT2, the switching element MT2 is turned off so that capacitors ($C_{gd}$, $C_{gs}$, $C_{ds}$) are charged with the drive current ($I_{ds}$).

Diode D2 is coupled between the node D and the node S. The diode D2 is coupled in a forward direction between the node S and the node D, so that the diode D2 has a voltage level of Vds.

Figure 4:
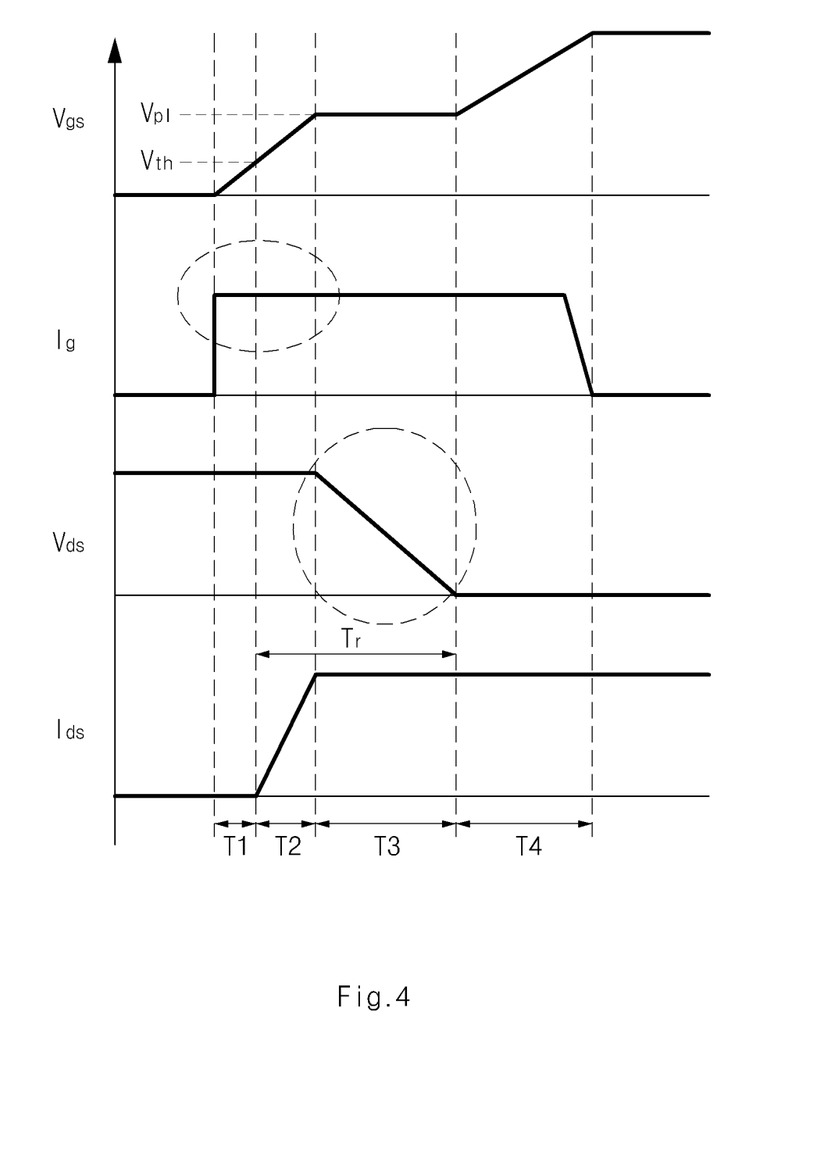
FIG. 4 is a timing diagram illustrating operation of the motor driving device shown in FIG. 3.

FIG. 4 is a timing diagram illustrating an operation of the motor driving device shown in FIG. 3 according to another embodiment. The operation of the motor driving device shown in FIG. 3 will hereinafter be described with reference to FIG. 4.

First, prior to reaching the period T1, the drive voltage ($V_{gs}$), the current ($I_g$), and the drive current ($I_{ds}$) are maintained at a low-level state. The voltage ($V_{ds}$) is maintained at a high-level state.

Thereafter, during the period T1, the PWM signal is applied to the drive semiconductor 300, the current ($I_g$) is transitioned to a logic high level, so that the drive voltage ($V_{gs}$) gradually increases. The current level ($I_g$) gradually increases up to the current level of IgT3 or higher, and is then maintained at the period T4. In this case, the current level ($I_g$) can be maintained at a predetermined current level without generating an abrupt increasing period in which the current level ($I_g$) abruptly increases due to the presence of a constant current of the constant-current source CC. The drive voltage ($V_{gs}$) increases by a threshold voltage ($V_{th}$).

In this case, the current ($I_g$) is limited by the constant-current source CC and the resistors ($R_{hi}$, $R_g$) such that the current ($I_g$) is prevented from excessively increasing. In this case, the resistor ($R_{ext}$) of the drive unit 320 has a resistance value higher than that of the resistor ($R_g$).

Subsequently, during the period T2, the current level ($I_g$) is maintained at the level IgT3. The drive voltage ($V_{gs}$) increases up to the voltage level ($V_{pl}$). The voltage ($V_{pl}$) may correspond to a plateau voltage for increasing the drive voltage ($V_{gs}$).

As a result, the switching element MT2 of the motor controller 300 is turned on. In this case, if the drive voltage ($V_{gs}$) increases up to the threshold voltage ($V_{th}$) or higher, the switching element MT2 is turned on. Accordingly, during the period T2, a current level of the drive current ($I_{ds}$) gradually increases such that the capacitor ($C_{gs}$) is charged with the drive current ($I_{ds}$).

In this case, the switching time of the switching element MT2 is associated with a frequency of the PWM signal. As the switching time gradually increases, harmonic components of the PWM signal are gradually reduced, resulting in reduction of the frequency. From the viewpoint of electromagnetic compatibility (EMC), the slope of the voltage ($V_{ds}$) is of importance to the relationship between the switching time of the switching element MT2 and EMC.

Accordingly, the motor driving device for a vehicle according to another embodiment can precisely control the frequency and slew rate of the PWM signal in response to a specific value that is configured in the register 310 by software. In particular, the rising time and the falling time of the switching element MT2 are distinguished from each other according to the drive voltage ($V_{ds}$) such that EMC tuning is facilitated. The switching time of the switching element MT2 is affected by various factors, for example, a current value of the constant-current source CC, a threshold voltage ($V_{th}$) of the switching element MT2, a plateau voltage ($V_{pl}$), and a supply voltage.

Subsequently, during the period T3, the drive voltage ($V_{gs}$) is maintained at a predetermined voltage ($V_{pl}$) level. The current ($I_g$) is maintained at a predetermined current level IgT3 without change. As a result, the voltage level ($V_{gs}$) is gradually reduced.

If the current ($I_g$) is limited by the constant-current source CC, the slope along which the voltage ($V_{ds}$) is reduced is not affected by the supply voltage. The drive current ($I_{ds}$) is maintained at a predetermined current level. In this case, the capacitor ($C_{gd}$) is charged with the current value ($I_g$) before the voltage ($V_{ds}$) is reduced to zero (0V).

As described above, the rising time before the switching element MT2 is enabled to a logic high level is denoted by the duration (T2+T3). The falling time of the switching element MT2 may also be denoted by the duration (T2+T3). Accordingly, the switching time of the switching element MT2 may be adjusted by a current value of the constant-current source CC.

Subsequently, during the period T4, the drive voltage ($V_{gs}$) level gradually increases up to the voltage ($V_{pl}$) or higher, and the current level ($I_g$) gradually decreases to a desired level IgT3 or less, such that the drive voltage ($V_{ds}$) is transitioned to a logic low level state and the drive current ($I_{ds}$) is maintained at a high level state.

As described above, the motor driving device for a vehicle according to the present invention classifies a control period of the charging/discharging current amount into four stages T1~T4, and more precisely controls the charging/discharging current amount according to the four stages T1~T4, such that EMC tuning is facilitated.

As is apparent from the above description, the motor driving device for a vehicle according to the present invention has the following effects.

First, the switching time of each MOS transistor contained in an external motor controller of a drive semiconductor of the motor driving device is identified so that the motor driving device for a vehicle can be more precisely controlled.

Second, it is possible to perform EMC tuning according to a predetermined software algorithm as well as external elements, such that the development period can be reduced and an objective performance of electromagnetic waves can be easily achieved.

Third, the motor driving device for a vehicle according to the present invention can drive the motor controller through a constant-current control scheme for use in the drive semiconductor, irrespective of variation of external power source.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A motor driving device for a vehicle, comprising:
   a motor controller configured to control driving of a motor in response to operation of a switching element; and
   a drive semiconductor configured to control a drive current of the motor controller in response to a predetermined register value, and control electromagnetic compatibility (EMC) tuning by adjusting a switching time of the switching element in response to a drive current that is charged or discharged in or from the motor controller;
   wherein the drive semiconductor includes:
      a register configured to output a pulse width modulation (PWM) signal for adjusting a slew rate in response to the predetermined register value; and
      a drive unit configured to drive a current for controlling the motor controller in response to the PWM signal;
      a second resistor coupled between an output terminal of the drive unit and a first node; and
      a third resistor coupled between the first node and the motor controller.

2. The motor driving device according to claim 1, wherein:
   a high-level enable period of the PWM signal is configured in response to a value established in the register so as to control a turn-on time of the switching element.

3. The motor driving device according to claim 1, wherein the drive unit includes a first resistor for controlling the current.

4. The motor driving device according to claim 3, wherein the first resistor is coupled between an output terminal of the drive unit and a back-bias voltage terminal so as to adjust a drive current of the switching element.

5. The motor driving device according to claim 1, wherein the drive unit includes a constant-current source to control the current.

6. The motor driving device according to claim 5, wherein the constant-current source is coupled between an output terminal of the drive unit and a ground voltage terminal so as to adjust a drive current of the switching element.

7. The motor driving device according to claim 5, wherein the current generated from the drive unit is constantly controlled by the constant-current source, before the switching element is turned on.

8. The motor driving device according to claim 1, wherein the motor controller includes:
   first and second capacitors coupled between a second node and a third node so as to control a charging operation of the drive current in response to a drive voltage of the drive semiconductor;
   a third capacitor coupled in parallel to the first and second capacitors at a position between the second node and the third node; and
   the switching element coupled between the second node and the third node in such a manner that a switching operation of the switching element is controlled by an output signal of the drive semiconductor.

9. The motor driving device according to claim 8, wherein the switching element includes a Metal Oxide Semiconductor Field Effect Transistor (MOSFET).

10. The motor driving device according to claim 8, further comprising:
    a diode coupled in parallel to the switching element.

11. The motor driving device according to claim 1, wherein:
    the switching element of the motor controller is turned on when a logic high-level drive voltage of the drive semiconductor is applied to the motor controller so that a drive current flows in the motor controller; and
    the switching element of the motor controller is turned off when a logic low-level drive voltage is applied to the motor controller so that the motor controller is charged with the drive current.

* * * * *